(12) United States Patent
Fautz et al.

(10) Patent No.: US 8,427,157 B2
(45) Date of Patent: Apr. 23, 2013

(54) METHOD TO DETERMINE A PREDETERMINED SIGNAL AMPLITUDE IN MR MEASUREMENTS

(75) Inventors: Hans-Peter Fautz, Forchheim (DE); Franz Schmitt, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 547 days.

(21) Appl. No.: 12/635,165

(22) Filed: Dec. 10, 2009

(65) Prior Publication Data

US 2010/0141252 A1 Jun. 10, 2010

(30) Foreign Application Priority Data

Dec. 10, 2008 (DE) .................. 10 2008 061 455

(51) Int. Cl.
*G01V 3/00* (2006.01)
*A61B 5/055* (2006.01)

(52) U.S. Cl.
USPC ............ 324/314; 324/309; 324/307; 600/410

(58) Field of Classification Search .......... 324/300–322; 600/407–435; 382/128–131
See application file for complete search history.

(56) References Cited

U.S. PATENT DOCUMENTS

| | | | | |
|---|---|---|---|---|
| 2,831,147 | A * | 4/1958 | Weber | 315/39 |
| 4,684,891 | A * | 8/1987 | Feinberg | 324/309 |
| 5,270,653 | A | 12/1993 | Pauly | 324/309 |
| 5,726,569 | A * | 3/1998 | Krieg et al. | 324/307 |
| 6,005,391 | A | 12/1999 | Börnert et al. | 324/309 |
| 6,989,673 | B2 * | 1/2006 | Zhu | 324/318 |
| 7,053,618 | B2 * | 5/2006 | Zhu | 324/318 |
| 7,075,301 | B2 * | 7/2006 | Zhu | 324/318 |
| 7,075,302 | B2 * | 7/2006 | Zhu | 324/318 |
| 7,385,396 | B2 * | 6/2008 | Zhu | 324/309 |
| 7,528,601 | B2 * | 5/2009 | Fautz et al. | 324/307 |
| 7,800,368 | B2 * | 9/2010 | Vaughan et al. | 324/318 |

(Continued)

FOREIGN PATENT DOCUMENTS

| DE | 10 2006 058 162 B3 | 6/2008 |
|---|---|---|
| DE | 10 2007 044 463 A1 | 4/2009 |

OTHER PUBLICATIONS

"Transmit SENSE," Katscher et al., Magnetic Resonance in Medicine, vol. 49 (2003) pp. 144-150.

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and apparatus to determine a predetermined signal amplitude of an examination subject in an MR measurement in which multiple RF pulses are radiated into the examination subject in a pulse sequence in a pulse series with a repetition time TR that is smaller than the $T_2$ times of the examination subject, a target magnetization is established for a predetermined point in time after radiation of the respective RF pulse for essentially all RF pulses from the pulse series, a target flip angle and a target phase are determined for different regions of the examination subject for essentially all RF pulses depending on the respective target magnetization, a respective amplitude and phase response is determined for essentially all RF pulses to generate the respective target magnetization after radiation of the respective RF pulse, and the RF pulses with the respective determined amplitude and phase response are radiated into the examination subject.

10 Claims, 6 Drawing Sheets

U.S. PATENT DOCUMENTS

| | | | | |
|---|---|---|---|---|
| 8,120,359 | B2* | 2/2012 | Diehl et al. | 324/309 |
| 2005/0110487 | A1* | 5/2005 | Zhu | 324/309 |
| 2005/0110488 | A1* | 5/2005 | Zhu | 324/309 |
| 2005/0134267 | A1* | 6/2005 | Zhu | 324/309 |
| 2005/0134268 | A1* | 6/2005 | Zhu | 324/309 |
| 2007/0247155 | A1* | 10/2007 | Zhu | 324/318 |
| 2008/0129298 | A1* | 6/2008 | Vaughan et al. | 324/322 |
| 2008/0180099 | A1* | 7/2008 | Fautz et al. | 324/309 |
| 2009/0322329 | A1* | 12/2009 | Diehl et al. | 324/309 |
| 2010/0141252 | A1* | 6/2010 | Fautz et al. | 324/307 |
| 2010/0253336 | A1* | 10/2010 | Schneider et al. | 324/309 |
| 2010/0253344 | A1* | 10/2010 | Fautz | 324/309 |

OTHER PUBLICATIONS

"Parallel Excitation With an Array of Transmit Coils," Zhu, Magnetic Resonance in Medicine, vol. 51 (2004) pp. 775-784.

"Practical Implementation of Optimized Tissue-Specific Prescribed Signal Evolutions for Improved Turbo-Spin-Echo Imaging," Mugler et al. III, Proc. Intl. Soc. Mag. Reson. Med., vol. 11, (2003), p. 203.

Echoes—How to Generate, Recognize, Use or Avoid Them in MR-Imaging Sequences, Hennig, Concepts in Magnetic Resonance, vol. 3 (1991) pp. 125-143.

A Pictorial Description of Steady-States in Rapid Magnetic Resonance Imaging, Scheffler, Concepts in Magnetic Resonance, vol. 11, No. 5, (1999), pp. 291-304.

"Parallel RF Transmission With Eight Channels at 3 Tesla," Setsompop et al., Magnetic Resonance in Medicine, vol. 56 (2006) pp. 1163-1161.

Fast-$k_z$ Three-Dimensional Tailored Radiofrequency Pulse for Reduced $B_1$ Inhomogeneity, Saekho et al., Magnetic Resonance in Medicine, vol. 56 (2006) pp. 719-724.

"Multiecho Sequences With Variable Refocusing Flip Angles: Optimization of Signal Behavior Using Smooth Transitions Between Pseudo Steady States (TRAPS)," Hennig et al., Magnetic Resonance in Medicine, vol. 49 (2003) pp. 527-535.

"Three-Dimensional T2-Weighted Imaging of the Brain Using Very Long Spin-Echo Trains," Mugler III et al., Proc. $8^{th}$ Annual Meeting of ISMRM (2000) p. 687.

"Reducing SAR in Real-Time SSFSE Imaging with Variable-Flip Hard Refocusing RF Pulses," Busse et al., Proc. Intl. Soc. Mag. Reson. Med., vol. 9, (2001) p. 1790.

"$B_1$-Insensitive Fast Spin Echo Using Adiabatic Square Wave Enabling of the Echo Train (SWEET) Excitation," Madhuranthakam et al., Magnetic Resonance in Medicine, vol. 59 (2008) pp. 1386-1393.

"The Sensitivity of Low Flip Angle RARE Imaging," Alsop, Magnetic Resonance in Medicine, vol. 37 (1997) pp. 176-184.

"Calculation of Flip Angles for Echo Trains With Predefined Amplitudes with the Extended Phase Graph (EPG)-Algorithm: Principles and Applications to Hyperecho and TRAPS Sequences," Hennig et al., Magnetic Resonance in Medicine, vol. 51 (2004) pp. 68-80.

"Stabilization of Echo Amplitudes in FSE Sequences," Le Roux et al., Magnetic Resonance in Medicine, vol. 30 (1993) pp. 183-191.

"Advanced Three-Dimensional Tailored RF Pulse for Signal Recovery in $T^*_2$-Weighted Functional Magnetic Resonance Imaging," Yip et al., Magnetic Resonance in Medicine, vol. 56 (2006) pp. 1050-1059.

* cited by examiner

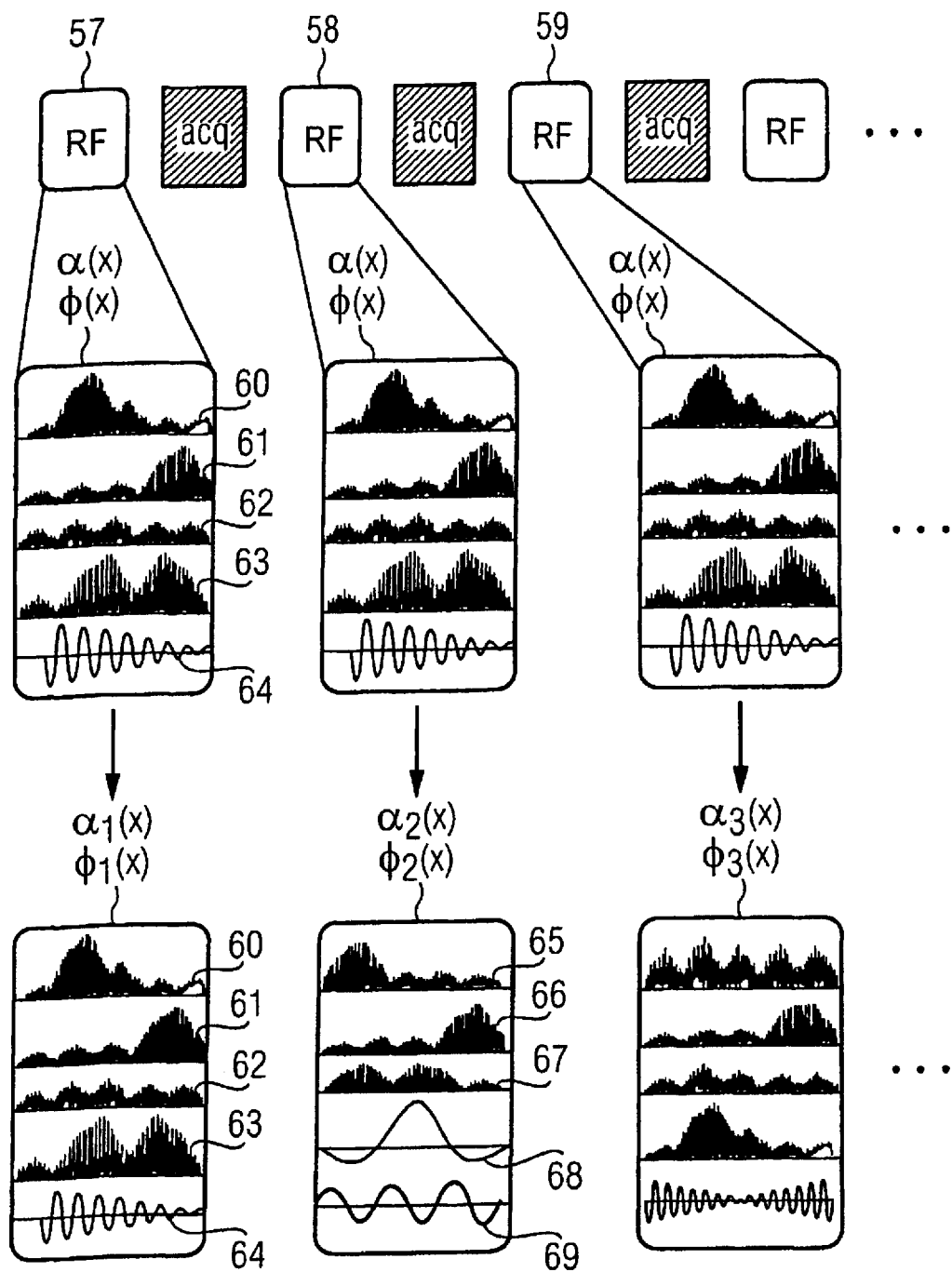

METHOD TO DETERMINE A PREDETERMINED SIGNAL AMPLITUDE IN MR MEASUREMENTS

BACKGROUND OF THE INVENTION

1. Field of the Invention

The present invention concerns a method to determine a predetermined signal amplitude of an examination subject in a magnetic resonance measurement in which, given a pulse sequence, multiple RF pulses are radiated into an examination subject in a pulse series; the invention also concerns an MR system for this. The invention is particularly suitable to reduce spatial image inhomogeneities in MR exposures that are caused by the spatial variation of the RF field distribution in the examination subject.

2. Description of the Prior Art

In whole-body imaging, artifacts occur in the image in MR systems, particularly with systems employing high field strengths (for example 3 Tesla), which has previously prevented a wider prevalence of such examinations. These image artifacts are reinforced with the increase of the field strength $B_0$ that is used. They occur increasingly at even higher field strengths and also increasingly affect the imaging of the head at these field strengths.

Artifacts and inconsistencies in MR imaging and spectroscopy due to inhomogeneous $B_1$ fields (i.e. the radiated radio-frequency fields) have long been known in magnetic resonance engineering. With conventional methods it is not possible to directly affect the $B_1$ homogeneity of RF fields, such that conventional methods are largely based on being made as insensitive as possible to the $B_1$ inhomogeneity. For example, composite pulses and adiabatic pulses are used, but these pulses have a limited applicability with regard to achievable flip angles, phase response in the use for slice selection, pulse times and the absorption rate given the radiation of RF power into a body. For this reason, such pulses are typically used for the preparation of the magnetization but could not become accepted for use in the excitation and refocusing of the magnetization in imaging sequences.

Furthermore, imaging sequences are known that are inherently less sensitive to flip angle variations or magnetization preparations in order to reduce the sensitivity of a subsequent imaging sequence (see Madhuranthakam et al, "$B_1$-insensitive fast spin echo using adiabatic square wave enabling of the echo train (SWEET) excitation", Magn Reson Med 59 (6) 1386-1393, 2008). Furthermore, it is known to achieve a spatial modulation of the generated transversal magnetization via a simultaneous action of RF and gradient pulses on the spin system. The achievable homogeneity of two-dimensional or three-dimensional pulses is not limited in principle; however, these modulations lead to very long pulse times. These pulse times can be shortened with the possibility of the parallel emission with multiple RF channels (see Katscher et al, "Transmit SENSE", Magn Reson Med 49 (1) 144-150, 2003 and Zhu, "Parallel excitation with an array of transmit coils", Magn Reson Med 51 (4) 775-784, 2004). However, the achievable pulse times are always still too long, such that they cannot replace the previously common slice-selective or non-selective pulses in the prevalent imaging sequences. Methods for the compensation of $B_1$ field inhomogeneities of a single excitation that use fewer partial trajectories are likewise known that scan only a few k-space points (see Saekho et al "Fast-kz three-dimensional tailored radiofrequency pulse for reduced B1 inhomogeneity", Magn Reson Med 55, 719-724, 2006 and Setsompop et al "Parallel RF transmission with eight channels at 3 Tesla", Magn Reson Med 56, 1163-1171, 2006.

A direct influence on the RF field is possible via the temporally simultaneous radiation of RF pulses with multiple spatially separated RF transmission coils or, respectively, RF channels. The generated RF field can be spatially modulated by adaptation of phase and amplitude values in multiple RF transmitters operated in parallel. The achievable homogeneity is essentially limited by the number of available parallel transmission channels. The method of parallel transmission has the advantage that it can be applied directly to all prevalent imaging methods without a temporal modification of the imaging sequences.

Periodic imaging sequences in which RF pulses with a predetermined flip angle and phase angle are radiated at specific temporal intervals are used almost exclusively in MR imaging. In modern fast imaging sequences, the RF pulses follow one another so quickly that the transverse and longitudinal magnetization generated by an RF pulse have not yet relaxed again before the following RF pulse. In other imaging sequences (such as multispin echo sequences or specific gradient echo sequences), the RF pulses also follow one another at short intervals in order to generate multiple different phase-coded MR signals. In this case, the evolution of the spin system is very complex and, under the circumstances, is already very difficult to calculate with the Bloch equations after only a few pulses. The extended phase graph algorithm (EPG) is a k-space-analog description of the Bloch equations for the evolution of the spins that are exposed to a series of hard pulses (see for example Hennig, "Echoes—how to generate, recognize, use or avoid them in MR-imaging sequences", Conc Magn Reson 1991; 3:125-143 and Alsop, "The sensitivity of low flip angle RARE imaging", Magn Reson Med 1997; 37:176-184). Here the spin system is described with the aid of different dephasing states, and the number of possible states grows three times faster than the number of RF pulses. Only one state is read out in an echo (thus the actual MR signal) depending on the sequence. The population of this state (i.e. the signal strength of the echo) is fed from many possible echo paths that are populated in the course of the RF series depending on the corresponding flip angles and phases of the applied pulses. The magnetization forming the echo can be unambiguously determined from the flip angles and phases of the pulses. The relaxation times must also be known given consideration of the relaxation.

The inverse problem—the calculation of flip angles and phases that leads to an echo train with predefined amplitudes—is not unambiguous. Also, no general methods are known that determine an indefinite solution for a complete echo train. However, there are methods known as "look ahead" methods that, starting from a magnetization state, calculate the required flip angle in order to come to a predefined signal amplitude with one pulse or a few pulses. It has been shown that flip angle-dependent equilibrium states can be prepared. With a continuous series of m flip angles with initial value $\alpha(m)$ and end value $\alpha(n+m)$, a switch can be made between the equilibrium state belonging to the initial or, respectively, end flip angles without generating strong signal fluctuations (see Alsop, "The sensitivity of low flip angle RARE imaging", Magn Reson Med 1997; 37:176-184 and Hennig et al, "Multiecho sequences with variable refocusing flip angles; optimization of signal behavior using smooth transitions between pseudo steady states (TRAPS)", Magn Reson Med 2003; 49:527-535).

The possibility to generate a predefined magnetization with variable flip angles has previously been used in order to stabilize the signal amplitude in the echo train, for example, and to avoid signal fluctuations (see LeRoux et al, "Stabilization of echo amplitudes in FSE sequences", Magn Reson Med 1993; 30:183-191). Furthermore, the possibility has been utilized to reduce the energy deposition in the body, i.e. the signal absorption or SAR (Signal Absorption Rate). Small flip angles are used in a segment of the echo train in which signals for outer k-space regions are acquired while the flip angle is gradually increased in order to generate the signals for the middle k-space regions (see the aforementioned articles by Busse et al and Hennig et al, and Hennig, "Calculation of flip angles for echo trains with predefined amplitudes with the extended phase graph (EPG)-algorithm: principles and applications to hyperecho and TRAPS sequences", Magn Reson Med 2004; 51:68-80). This possibility is likewise used in order to slow the signal decay along the echo train and to enable longer echo trains for three-dimensional, fast spin echo acquisitions (see the aforementioned articles by Alsop and Hennig et al, as well as "Practical Implementation of Optimized Tissue-Specific Prescribed Signal Evolutions for Improved Turbo-Spin-Echo Imaging," Mugler et al. III, Proc. Intl. Soc. Mag. Reson. Med., Vol. 11, (2003), pg 203 and "Three-Dimensional T2-Weighted Imaging of the Brain Using Very Long Spin-Echo Trains," Mugler III et al., Proceedings 8th Annual Meeting of ISMRM (2000) pg 687).

Furthermore, it is possible to reduce the sensitivity of fast spin echo sequences to $B_1$ field inhomogeneities. A magnetization state is hereby prepared on which—starting from subsequently generated echo amplitudes—optimally few of the employed flip angles of the applied pulses depend (see the aforementioned Madhuranthakam et al article).

However, the problem of reducing the artifacts due to $B_1$ inhomogeneity (in particular at higher field strengths) in MR exposures continues to exist.

SUMMARY OF THE INVENTION

An object of the present invention is to further reduce the $B_1$-dependent magnetic field inhomogeneities and the artifacts that are generated under the conditions described above.

This object is achieved according to the invention by a method to determine a predetermined signal amplitude of an examination subject in an MR measurement in which multiple RF pulses are radiated into the examination subject in a pulse sequence in a pulse series. A target magnetization for a predetermined point in time after radiation of the respective RF pulse is established for essentially all RF pulses of the pulse series. In a further step, a target flip angle and a target phase for different spatial regions of the examination subject are determined for essentially all RF pulses depending on the respective target magnetization that should be created after generation of the respective RF pulse and depending on regions of the existing magnetization in the different regions. In order to achieve the target flip angles and target phases, the temporal workflow of the amplitude and phase response for essentially all RF pulses are furthermore respectively determined, and the RF pulses are radiated into the examination subject with the respective determined amplitude and phase response.

The invention is based on the insight to generate a spatial modulation of the magnetization by spatially varying the spatially inhomogeneous flip angle and phase profile of the RF pulses across the pulse series corresponding to the target magnetization. This means that each magnetization experiences a different order of flip angles and phases depending on the location, while taking into account that a predefined signal amplitude (the target magnetization) can simultaneously be read out at a given point in time in the pulse series.

These target flip angles and target phases then lead to the predefined magnetization (the target magnetization). Methods as they are known from the prior art (for example the "look ahead" method as mentioned above) in order to calculate the flip angle and the phase that generate a predefined magnetization can be used for every pixel or, respectively, every region in the examination subject for the determination of the spatial target flip angle and target phase. The RF pulses are advantageously radiated simultaneously with multiple RF transmission channels, wherein the amplitude and phase response for all transmission channels is determined in order to achieve the spatially predetermined target flip angle in the different regions of the examination subject. The amplitude response and phase response for all transmission channels are advantageously determined for every RF pulse of the pulse series. This means that the amplitude and phase response is determined before the radiation for every RF channel and for every RF pulse of the pulse series.

According to a preferred embodiment of the invention, the magnetization is calculated after radiation of the i-th RF pulse from the pulse series with n pulses, with i=1 through n, and is used as a start magnetization in the determination of the target flip angle and the target phase for different regions of the examination subject in the i+1-th RF pulse. This means that the effect of all i pulses with i smaller than i+1 on the magnetization is calculated and is used as the existing magnetization in order to calculate the spatial map of the target flip angles and target phases to achieve the target magnetization in the step i+1. The development of the magnetization between the i-th and the i+1-th RF pulse is advantageously taken into account for the determination of the start magnetization.

For example, this can develop through the data acquisition and the simultaneous switching of gradients. The present magnetization is taken into account since the $T_2$ times of the examined tissue portions are greater than or equal to the repetition time TR, such that the magnetization still present from the preceding pulse must be taken into account. The examination subject can have tissue with different $T_2$ times, but the $T_2$ times lie in a range such that the transversal magnetization of at least some tissue components has not yet decayed before the next RF pulse follows after a repetition time TR. This existing magnetization is then taken into account in the calculation of the target flip angles and target phases.

It can be desirable for the target magnetization to be essentially the same for all RF pulses of the pulse series. If it is achieved that the same magnetization is respectively detected in the signal detection in the different phase coding steps during the pulse series, this means a good image quality overall. This consistent magnetization can be achieved via identical target magnetizations after each RF pulse, for example.

It can be desirable to achieve a predetermined magnetization, in particular at one or more points in time (for example upon readout of the k-space center). In this case it can be advantageous to match (adapt) the individual target magnetizations in the different phase coding steps to this goal. This means that the target magnetizations for the individual RF pulses can by all means differ in order to achieve a more precise agreement with the target magnetization at individual points in time.

It is likewise possible to take additional design goals into account in addition to the target magnetization in the determination of the target flip angles and phases. In particular, it can be advantageous to define target flip angles and phases so that the specific absorption rate (SAR) is minimized across the image acquisition. In general, all goals (signal stabilization, SAR minimization, modification of the signal decay and contrast, magnetization preparation etc.) that are known from spatially non-selective flip angle design can be taken into account in the determination of the target flip angles and phases for the individual RF pulses.

Furthermore, it is possible that pulse sequence-dependent boundary conditions must be taken into account in the determination of the target flip angles and target phases. Depending on the imaging sequence, different general conditions can apply for the calculation of the target flip angles and phases. For example, in a CMPG (Car Purcell Meiboom Gill) sequence the phase cannot be freely selected along the echo train.

Furthermore, the local phase of the RF pulses can change over the pulse series, and in fact dependent on the location. The changing transmission phase is therefore no longer to be globally compensated via an adapted reception phase. However, the transmission phase is known for every location via the sensitivity maps of the coil and the pulse design. A phase correction of the data can therefore be retrospectively taken into account in the image reconstruction.

In order to achieve the excitation and refocusing profiles of the RF series that differ from RF pulse to RF pulse, the target flip angles and the target phases in the different regions of the examination subject are advantageously achieved by simultaneous radiation of RF pulses from the different RF transmission channels.

In order to achieve the target flip angles and target phases in the different regions of the examination subject, the magnetic field gradients that are switched during the RF pulses are also individually adapted.

This means that the RF pulse curve with amplitude and phase as well as the gradient pulse curve for every RF pulse is adapted in order to achieve the desired magnetizations in the different body region. Methods known from the literature can be used to calculate the individually adapted time curves of the RF and gradient pulses from the target flip angles and phases (see the aforementioned articles by Katschen et al, Zhu, Saeleho et al and Setsompop et al). In this step it can also be advantageous to take into account additional design goals, in particular the minimization of SAR of every individual RF pulse.

The invention furthermore concerns a magnetic resonance system to determine a predetermined signal amplitude of an examination subject in an MR measurement, wherein an RF transmission unit and a unit to determine a target magnetization are provided. This unit that determines a target magnetization does so by determining a target magnetization for a predefined point in time after radiation of the respective RF pulse for essentially all RF pulses from the pulse series. A computer determines a target flip angle and a target phase for different regions of the examination subject for essentially all RF pulses, for example for every pixel of the later MR image depending on the respective target magnetization. An RF control unit respectively determines an amplitude and phase response for essentially all RF pulses to generate the respective target magnetization after radiation of the respective RF pulses. The RF transmission unit then radiates the respective RF pulses with the respective determined amplitude and phase response. The RF transmission unit advantageously possesses multiple transmission channels, and the RF control unit determines the amplitude and phase response for all RF transmission channels in all RF pulses in order to achieve the target flip angles and target phases of the respective RF pulses.

BRIEF DESCRIPTION OF THE DRAWINGS

FIG. 6 shows a pulse series with multiple transmission channels according to the prior art and according to the present invention.

DESCRIPTION OF THE PREFERRED EMBODIMENTS

Figure 1:
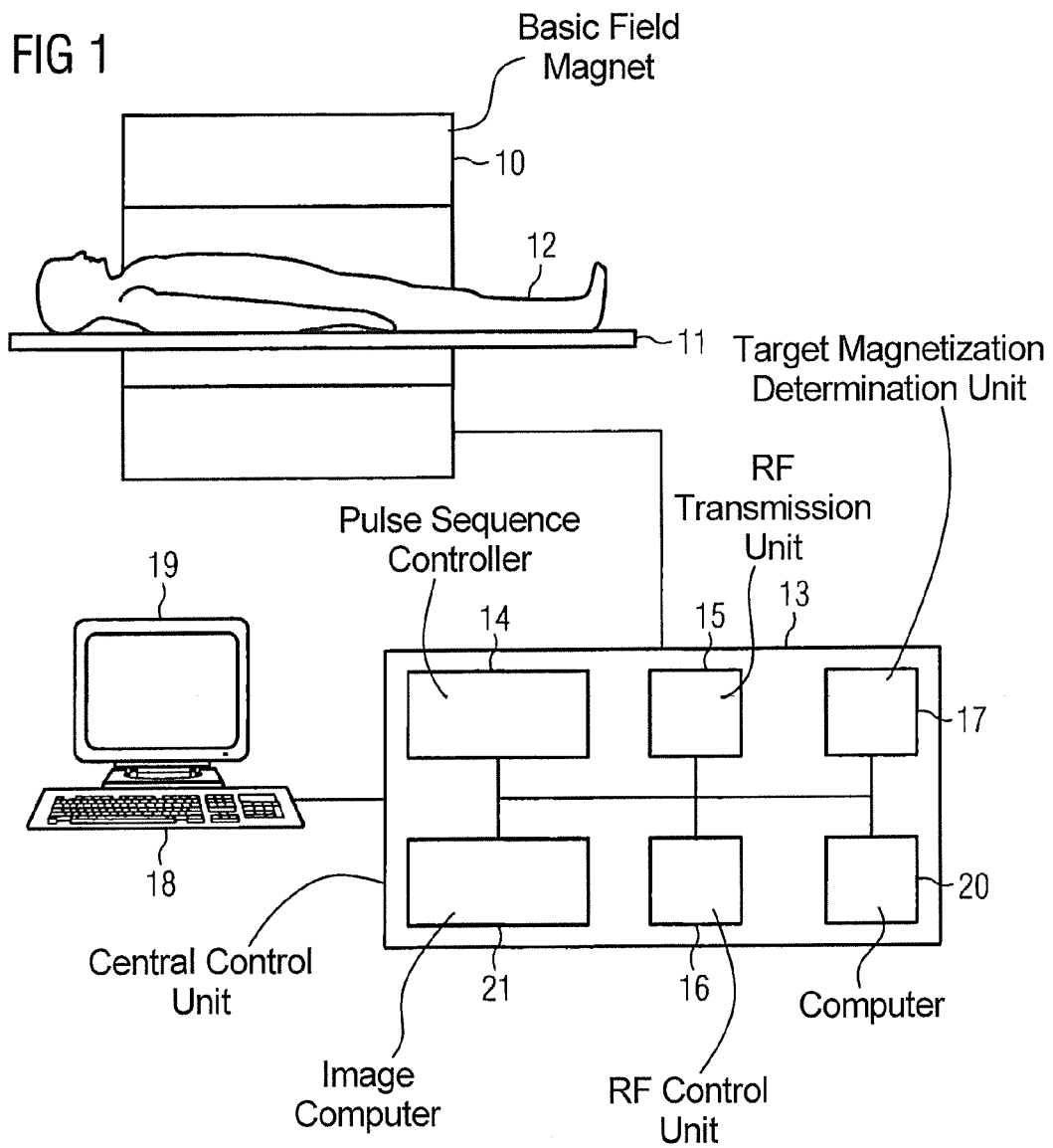
FIG. 1 schematically illustrates an MR system according to the invention.

An MR system according to the invention is presented in FIG. 1. This MR system has a basic field magnet 10 for the generation of a polarization field $B_0$. An examination subject 12 arranged on the bed 11 is driven into the isocenter of the magnet in order to generate MR images there via radiation of RF pulses and gradient fields. The manner by which MR images can be generated with such a pulse series of RF pulses to excite the given magnetization and via simultaneous switching of magnetic field gradients is known to those skilled in the art and need not be explained in detail herein. The MR system is connected with a central control unit 13 with which the workflow of an MR examination can be controlled. The control unit 13 can have a pulse sequence controller 14 that controls the workflow when RF pulses and gradient fields must be generated. An RF transmission unit 15 is likewise provided that advantageously possesses multiple RF transmission channels that can be individually controlled and supplied with RF power. To control the RF transmission unit 15, an RF control unit 16 is provided which establishes the amplitude and phase response for the different transmission channels in order to achieve a predefined magnetization (for example the target magnetization) given an RF pulse. Furthermore, a unit 17 is provided to determine the target magnetizations after the individual RF pulses. For example, the target magnetization can be input into the system via an input unit 18 on a screen 19 for an operator, or it can be provided by the system depending on the imaging sequence. A computer 20 calculates a map of target flip angles and target phases for different regions of the examination subject depending on the defined target magnetization for the examination region. An image computer 21 can then calculate MR images from the detected magnetizations (as is known), which MR images can then be presented on the display unit 19, for example. The units provided in the central control unit 13 have been presented as separate units. Naturally, these units do not need to be fashioned as separate units. For example, various units can be combined into a merged unit, or processors can be provided that implement the function ascribed to a unit with the aid of commands.

Figure 2:
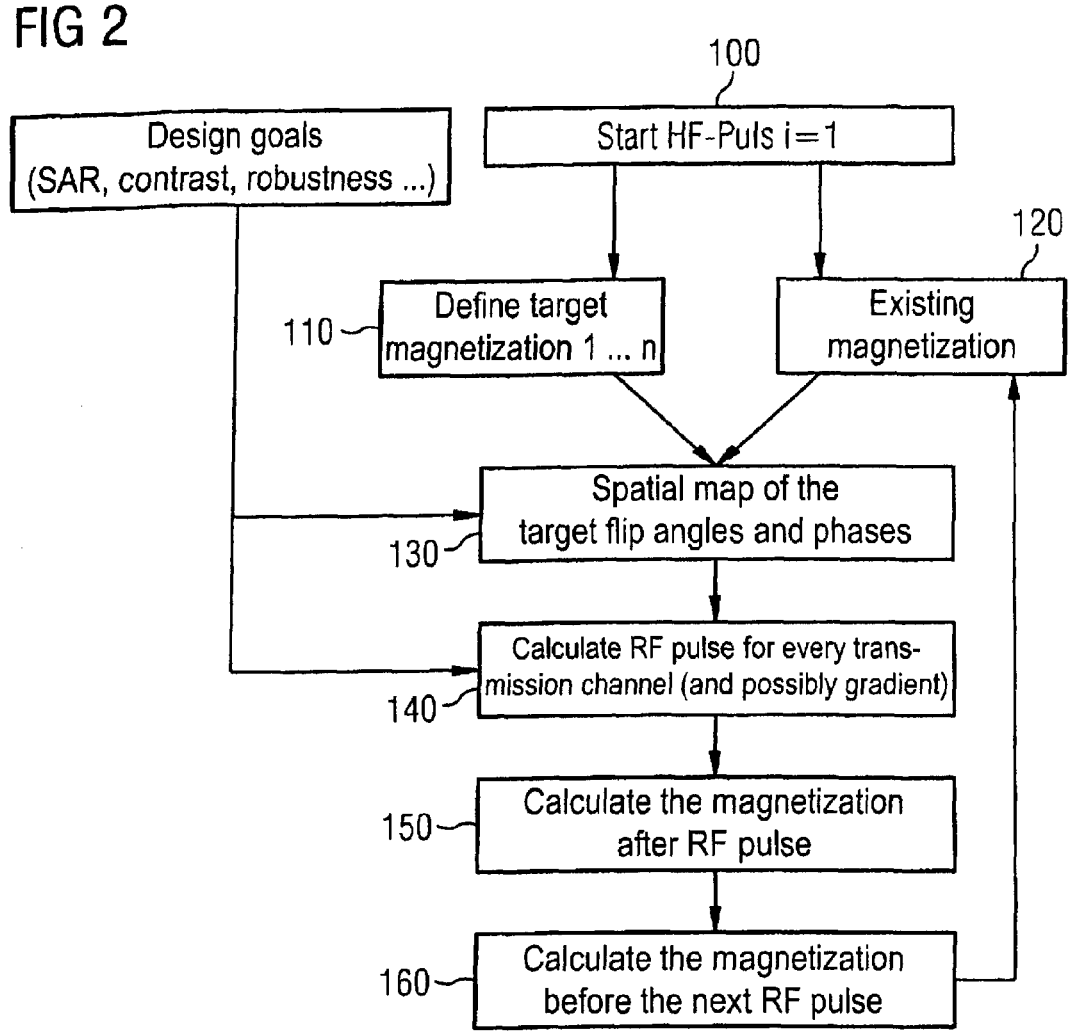
FIG. 2 is a flowchart for the generation of an MR image with a predefined signal amplitude.

A flowchart diagram with which an MR signal with predetermined signal amplitude can be achieved is shown in FIG. 2. After the start of the method for the first RF pulse in Step 100, the target magnetizations for the n RF pulses of the pulse series are defined in Step 110, wherein in the simplest case these are all identical. Furthermore, the present magnetization is determined in an additional Step 120. In a first iteration step, for example, this can be the initial magnetization in the direction of the $B_0$ field with $(M(x), M(y), M(z))=(0,0,M(z)$ 0). In the next step 130, spatial maps of the target flip angles and target phases are calculated for different spatial regions using the respective present target magnetization and the existing magnetization. In a step 140, an RF pulse for every transmission channel is then calculated from the spatial maps of the target flip angles and target phases. For example, this can ensue with methods of the prior art, what are known as RF shimming or k-space-based 2D or 3D pulse design. If the RF transmission unit possesses multiple transmission channels, the calculation ensues for every transmission channel. Additional specifications that play a role in the image sequence design can also be taken into account in the steps 130 and 140. The target flip angles and the target phases can, for example, be determined under consideration of the specific absorption rate (SAR), such that the SAR minimized. After every RF pulse, the magnetization is calculated in a step 150, meaning that the effect of the pulse on the magnetization is calculated, and in a step 160 the evolution of the magnetization between the pulses is calculated and is returned as a present magnetization to step 120 in order to in turn determine a spatial map of target flip angles and target phases for the next RF pulse with the next magnetization and the magnetization calculated in Step 160. Since an existing transversal magnetization is still present before radiation of the next RF pulse, this should be taken into account in the calculation of the spatial map of the target flip angles and target phases. The method ends when the amplitude and phase response has been determined for all RF pulses of the pulse series. In one variant of the embodiment shown in FIG. 2, the magnetization calculated in Step 160 can be used in order to additionally update the target magnetization in every iteration based on the actual existing magnetization that was calculated in Step 160.

In a further embodiment, the entire imaging sequence can be viewed as an optimization problem, which in principle means that existing solution methods for the optimization of a pulse can be used in order to optimize the entire pulse series according to the same criteria. The entire pulse series is treated as an RF pulse, wherein specific general conditions must be satisfied: for example, an echo must be acquired at specific times during the data acquisition, or the magnetization present at the point in time must satisfy specific general conditions. Furthermore, the gradients necessary for data acquisition are not freely selectable.

In most imaging sequences, the magnetization is read out multiple times at different phase coding steps, wherein one or two RF pulses ensue in every phase coding step to generate the signal/echo. The $B_1$-dependent signal inhomogeneity can be reduced via the calculation of the spatial flip angle and phase distribution of the RF pulses along the pulse series (i.e. typically along the phase coding direction) in that predetermined signal amplitudes are predetermined in the different regions of the examination subject.

To understand the invention, in the following pulse series according to the prior art and according to the invention are compared with one another.

Figure 3:
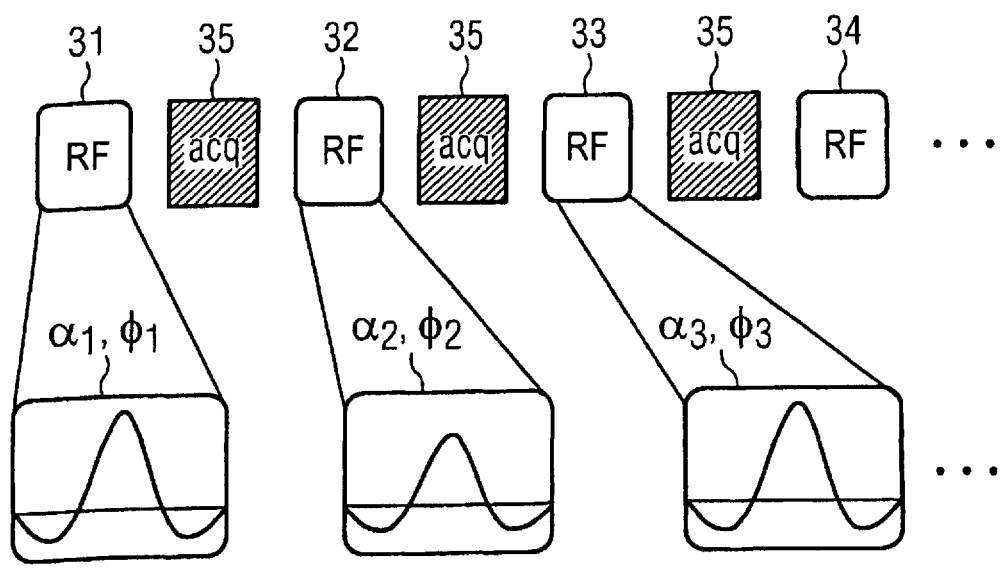
FIG. 3 schematically illustrates imaging with a transmission channel according to the prior art.

A pulse series according to the prior art is shown in FIG. 3, wherein the RF pulses are generated with a transmission channel. The imaging sequence is a series of RF pulses 31-34, wherein a signal readout 35 ensues after every RF pulse until the signal acquisition is ended with a desired resolution. For example, different flip angles and phases can be used to stabilize the signal amplitude. For example, the radiation of the RF pulse 31 ensues with the flip angle $\alpha_1$ and the phase $\phi_1$, the radiation of the second RF pulse ensues with the flip angle $\alpha_2$ and the phase $\phi_2$ etc.

Figure 4:
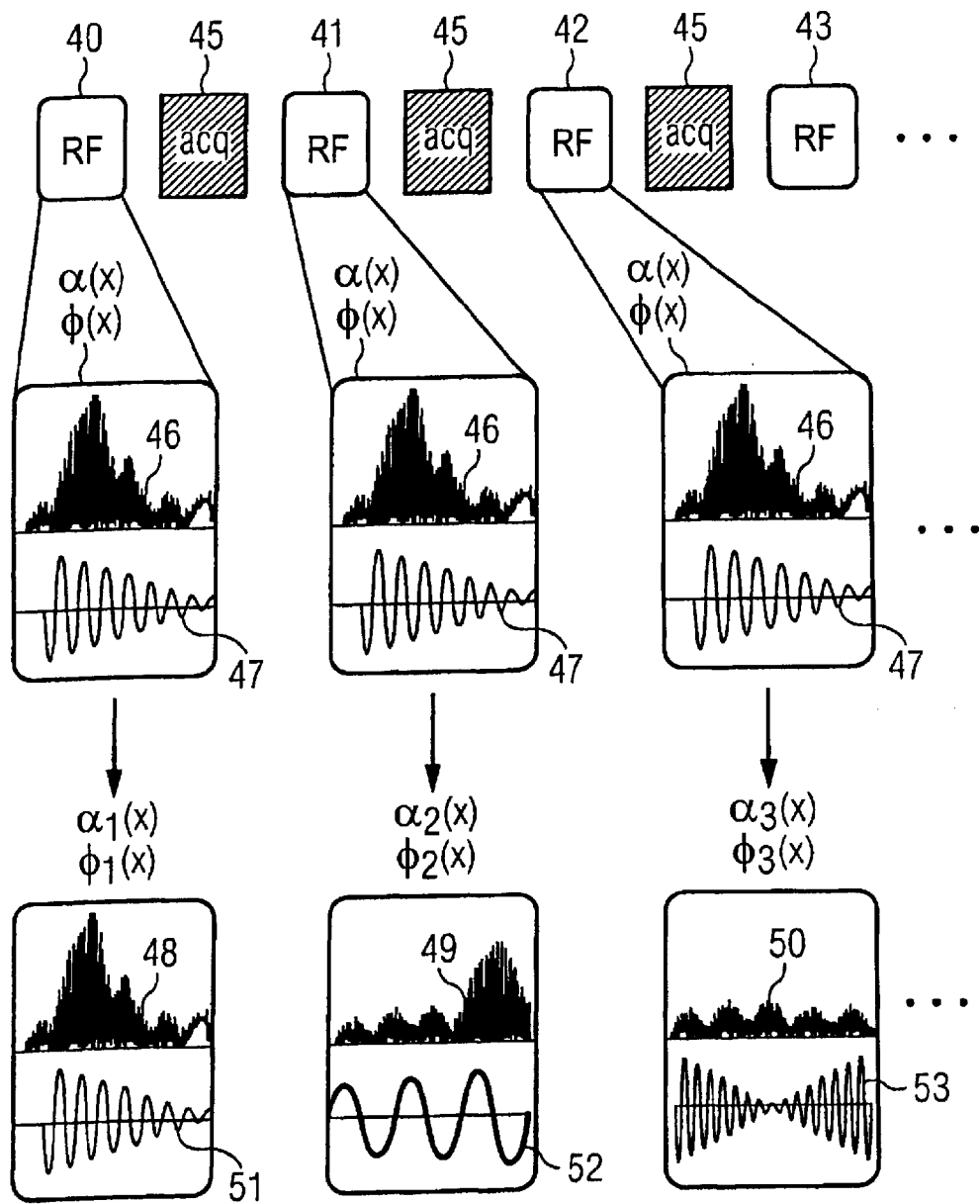
FIG. 4 shows a pulse series according to the prior art and, in comparison, according to the invention.

A method according to the prior art in which RF pulses optimized is likewise shown at the top in FIG. 4. For spatial modulation of the transversal magnetization, an RF pulse 40 with a spatial varied phase and a spatially varying flip angle is radiated in a transmission channel with temporally variable gradient, as is schematically represented by the amplitude curve 46 and the gradient pulse curve 47. These amplitude, phase and gradient curves are identical for all RF pulses in the prior art. In a method according to the present invention, the first RF pulse 40 has, for example, a spatially variable flip angle $\alpha_1(x)$ with a spatially variable phase $\phi_1(x)$, the second RF pulse 41 has a spatially variable flip angle $\alpha_2(x)$ with a spatially variable phase $\phi_2(x)$ etc. The time curves of the RF pulses and the gradient developments that are calculated via the specification of the different flip angles are likewise shown. The amplitude developments 48 are likewise shown. The amplitude development 48 of the first RF pulse 40 is different than the amplitude development 49 and than the amplitude development 50 of the RF pulses 41 and 42. The gradient developments 51, 52 and 53 of the RF pulses 40, 41 and 42 are likewise different. As is apparent from the lower part of FIG. 4, the RF pulses vary from acquisition step to acquisition step since the amplitude and phase response is recalculated for every step. In a first phase coding step, for example, the RF pulse 40 with the amplitude 48 and a predefined phase is used; the RF pulse with the amplitude 49 and a predefined phase is used in the second phase coding step; and the amplitude 50 with an additional phase is used in the third phase coding step. The RF pulses 48-50 are respectively radiated with the gradient curves 51-53.

Figure 5:
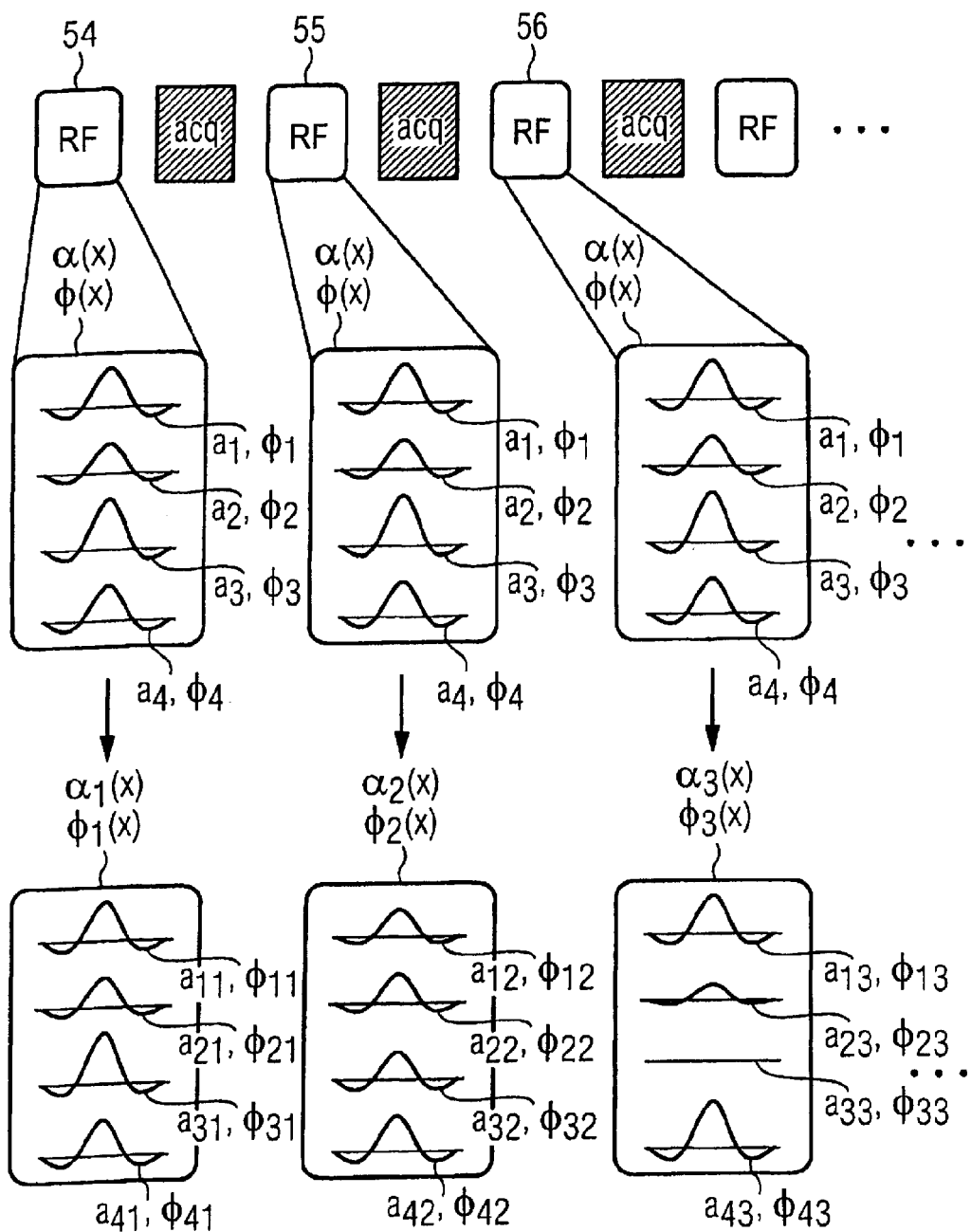
FIG. 5 shows an additional pulse series according to the prior art and according to the present invention.

The manner by which the adjustment of phases and amplitudes in multiple RF transmitters operated in parallel can lead to spatially modulated RF fields is shown in FIG. 5. This method is known as RF shimming. The RF shimming according to the prior art (at the top in FIG. 5) in which the phase and amplitude remain the same in every channel in each of the RF pulses 54-56 is known. According to the prior art, in the first channel the amplitude is thus $\alpha_1(x)$ and the phase is $\phi_1(x)$, wherein this amplitude and phase do not change in the course of the RF pulses. However, according to the method according to the invention, the amplitudes and phase weightings are recalculated for every pulse, meaning that the amplitudes $a_{11}$-$a_{41}$ and the phases $\phi_{11}$-$\phi_{41}$ are applied in the four channels in order to obtain the flip angle $\alpha_1(x)$ and the phase $\phi_1(x)$ while, in the second RF pulse 55, the amplitudes $a_{12}$-$a_{42}$ and the phases $a_{12}$-$a_{42}$ are used for the flip angle $\alpha_2$ and the phase $\phi_2$. A similar example as in FIG. 4 is shown in FIG. 6 with multiple transmission channels. The spatially selective excitation with multiple transmission channels according to the prior art is shown in the upper part of FIG. 6, wherein the RF pulses 57-59 have different amplitude curves in the different channels in order to achieve the flip angle $\alpha(x)$ and the phase $\phi(x)$, as is shown by the respective RF pulse curves 60-63 and an exemplary gradient curve 64. These amplitude curves and gradient curves shown by way of example are identical for all RF pulses 57-59.

According to the present invention, by contrast, a spatially variable flip angle $\alpha_1(x)$ with a spatially variable phase $\phi_1(x)$ is set with the first RF pulse, this spatially variable flip angle $\alpha_1(x)$ being achieved in the shown example using the RF pulse curves in the different channels 60-63 and the gradient curve 64 (as in the above example).

In order to achieve the flip angle $\alpha_2$ with the phase $\square_2$, according to the invention the amplitude response and the phase response are varied in the second RF pulse in the different channels, as is shown by the example of the amplitude curves 65-68 and the gradient curve 69. This makes it possible to take the evolution of the spin system over the entire pulse series into account and to allow the variation of the RF pulses and the gradient pulses from acquisition step to acquisition step as an additional degree of freedom for the optimization.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to determine a predetermined signal amplitude for essentially all RF pulses of a pulse sequence transmitted into an examination subject in an MR measurement, comprising:

in an MR measurement, radiating multiple RF radiations, each comprised of at least one RF pulse, into the examination subject in order to excite nuclear spins in the examination subject, with each excited nuclear spin having an associated T2 time, in a pulse sequence in which said RF radiations are repeated with a repetition time TR that is smaller than any of the T2 times of the excited nuclear spins, each of said RF pulses producing a magnetization of nuclear spins in the examination subject, thereby producing a plurality of successive magnetizations; and after each magnetization, reading out MR signals, produced by the excited nuclear spins for essentially all RF pulses of the pulse sequence establishing a target magnetization for a predetermined point in time after radiation of a respective RF pulse of the pulse series;

in a processor, determining a target flip angle and a target phase for different regions of the examination subject for essentially all RF pulses depending on the respective target magnetization and an existing magnetization that is residual due to a combination of preceding, respective magnetizations produced by RF pulses proceeding said respective RF pulse;

in said processor, respectively determining a time curve of the amplitudes and phases for essentially all RF pulses in order to cause, for each pulse, the respective target magnetization, to be achieved after radiation of the respective RF pulse; and radiating all of the RF pulses, in the pulse sequence, with the respective determined amplitude and phase response into said examination subject during the MR measurement.

2. A method according to claim 1 comprising, in each of said multiple RF radiations, radiating a plurality of RF pulses simultaneously respectively with multiple RF transmission channels, and in said processor, defining an amplitude and phase response for all RF transmission channels.

3. A method according to claim 1 comprising, in said processor, calculating the magnetization after radiation of an i-th RF pulse of the pulse series and applying the calculated magnetization as a start magnetization in determining of the target flip angle and the target phase for different regions of the examination subject in the i+1-th RF pulse.

4. A method according to claim 3 comprising, in said processor, determining the start magnetization dependent on development of the magnetization between the i-th and the l+1-th RF pulse.

5. A method according to claim 1 comprising, employing a target magnetization that is essentially the same for all RF pulses of the pulse series.

6. A method according to claim 1 comprising, in said processor, determining the target flip angles and the target phases dependent on sequence-dependent general conditions.

7. A method according to claim 1, comprising determining a magnetic field gradient depending on the respective target flip angle and the respective target phase of each RF pulse for the different regions, and simultaneously activating said magnetic field gradient with every RF pulse of the pulse series.

8. A method according to claim 1 comprising, in said processor, determining the target flip angles and the target phases of the RF pulses dependent on a minimized specific absorption rate (SAR) in the pulse series.

9. A magnetic resonance system in order to determine a predefined signal amplitude for essentially all RF pulses of a pulse sequence transmitted into an examination subject in a magnetic resonance measurement, said magnetic resonance system comprising:

an RF transmission unit;

a control unit configured to operate said RF transmission unit in an MR measurement in order to radiate multiple RF radiation, each comprised of at least one RF pulse into the examination subject in order to excite nuclear spins in the examination subject, in a pulse sequence in which said RF radiations are repeated with a repetition time TR that is smaller than any of the T2 times of the excited nuclear spins, each of said RF pulses producing a magnetization of nuclear spins in the examination subject, thereby producing a plurality of successive magnetizations;

said control unit after each magnetization being configured to read out MR signals, produced by the excited nuclear spins;

said control unit being configured, for essentially all RF pulses of the pulse sequence, to determine a target magnetization of essentially all RF pulses from the pulse sequence for a predefined point in time after radiation of a respective RF pulse of the sequence;

said control unit being configured to automatically determine a target flip angle and a target phase for different regions of the examination subject for essentially all RF pulses depending on the respective target magnetization and an existing magnetization that is residual due to a combination of preceding, respective magnetizations produced by RF pulses proceeding said respective RF pulse; and said control unit being configured to respectively determine an amplitude and phase response, for essentially all RF pulses in order to cause for each pulse the respective target magnetization, to be achieved after radiation of the respective RF pulse; and said control unit being configured to operate said RF transmission unit in order to radiate the respective RF pulses in said sequence into the examination subject with the respective determined amplitude and phase response into said examination subject during the MR measurement.

10. A magnetic resonance system according to claim 9, wherein the RF transmission unit comprises multiple RF transmission channels, and wherein the control unit is configured to radiate each of said RF radiations as a plurality of RF pulses respectively with said multiple RF transmission channels, and determine an amplitude and phase response for all RF transmission channels in all RF pulses in order to achieve the target flip angles and target phases of the respective RF pulses.

* * * * *